(12) United States Patent
Manfre et al.

(10) Patent No.: US 10,255,973 B2
(45) Date of Patent: Apr. 9, 2019

(54) MEMORY DEVICE AND METHOD OF OPERATION THEREOF

(71) Applicant: STMicroelectronics S.r.l., Agrate Brianza (IT)

(72) Inventors: Davide Manfre, Pandino (IT); Cesare Torti, Pavia (IT); Fabio Enrico Carlo Disegni, Spino d'adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/797,732

(22) Filed: Oct. 30, 2017

(65) Prior Publication Data
US 2018/0240519 A1 Aug. 23, 2018

(30) Foreign Application Priority Data

Feb. 21, 2017 (IT) .................. 102017000019514

(51) Int. Cl.
*G11C 13/00* (2006.01)
*G11C 8/16* (2006.01)
(52) U.S. Cl.
CPC .......... *G11C 13/0038* (2013.01); *G11C 8/16* (2013.01); *G11C 13/0004* (2013.01); *G11C 13/0023* (2013.01)

(58) Field of Classification Search
CPC .............. G11C 13/0069; G11C 13/004; G11C 13/0004; G11C 2213/72; G11C 13/0002; G11C 13/0007; G11C 13/003; G11C 16/3459; G11C 11/1659; G11C 11/5628; G11C 11/5642; G11C 13/0011
USPC ............ 365/148, 163, 185.03, 96, 173, 175, 365/185.18, 203, 210.1, 225.7, 100, 158, 365/171
See application file for complete search history.

(56) References Cited

U.S. PATENT DOCUMENTS

| 5,999,445 A | 12/1999 | Rolandi et al. |
| 5,999,450 A | 12/1999 | Dallabora et al. |
| 2009/0190393 A1* | 7/2009 | Kang ............... G11C 7/227 365/163 |
| 2011/0228594 A1 | 9/2011 | Rao et al. |
| 2015/0179257 A1 | 6/2015 | Lee et al. |

* cited by examiner

*Primary Examiner* — Thong Q Le
(74) *Attorney, Agent, or Firm* — Slater Matsil, LLP

(57) ABSTRACT

An embodiment memory device includes a memory array having a plurality of bit lines, a low-voltage connection path configured to connect, in an operational phase of the device, an access terminal to a selected local bit line of the plurality of bit lines, and a high-voltage connection path configured to connect, in the operational phase of the device, the access terminal to the selected local bit line, in parallel with the low-voltage connection path.

21 Claims, 5 Drawing Sheets

MEMORY DEVICE AND METHOD OF OPERATION THEREOF

CROSS-REFERENCE TO RELATED APPLICATIONS

This application claims priority to Italian Patent Application No. 102017000019514, filed on Feb. 21, 2017, which application is hereby incorporated herein by reference.

TECHNICAL FIELD

The present disclosure relates generally to memory, and in particular embodiments to a memory device and a method of operation thereof.

BACKGROUND

As is known, phase-change memories (or PCMs) are a new generation of non-volatile memories wherein, in order to store information, the characteristics of materials having the property of switching between phases with different electrical characteristics are exploited. These materials are able to switch between a disordered/amorphous phase and an ordered crystalline or polycrystalline phase. Different phases are characterized by different resistivity values and are associated with various values of a stored data. For example, the elements of group VI of the periodic table, such as tellurium (Te), selenium (Se) or antimony (Sb), also known as chalcogenides or chalcogenic materials, may be used for manufacturing phase-change memory cells; in particular, an alloy formed from germanium (Ge), antimony (Sb) and tellurium (Te), known as GST (having the chemical composition $Ge_2Sb_2Te_5$), is currently widely used in such memory cells.

The changes of phase may be obtained by locally increasing the temperature of the cells of chalcogenic material, using resistive electrodes (generally known as heaters) placed in contact with corresponding regions of chalcogenic material.

Access (or selection) devices (for example, MOSFET transistors) are connected to the heaters and selectively allow the passage of a modify electric current through them; by Joule effect, this electric current generates the temperature required for the change of phase.

In particular, when the chalcogenic material is in the amorphous state, and thus has a high resistivity (RESET state), it is necessary to apply a current/voltage pulse (or a suitable number of current/voltage pulses) having a duration and an amplitude such as to allow the chalcogenic material to cool down slowly. When subjected to this treatment, the chalcogenic material changes its state and switches from the high-resistivity state to a low-resistivity state (SET state). Vice versa, when the chalcogenic material is in the SET state, it is necessary to apply a current/voltage pulse having a suitable duration and a high amplitude, to cause the chalcogenic material to return into the amorphous RESET state with high resistivity.

During reading, the state of the chalcogenic material is detected by applying a sufficiently low voltage as not to cause a substantial heating, and then by reading the value of the current flowing in the memory cell through a sense amplifier. Since the current is proportional to the conductivity of the chalcogenic material, it is possible to determine the state of the material, and as a consequence to determine the datum stored in the memory cell.

Analogously to other memory types, in phase-change memories, the memory device has decoding stages that, depending on address signals supplied by a control unit, allow access to single memory cells or specific groups of memory cells, supplying the preset voltages and detecting the sought electrical characteristics.

In particular, phase-change memories have separate column decoding stages for reading and modify phases. In fact, as explained above, these phases require significantly different voltage (and current) levels to be applied. As a consequence, the column decoding stages are optimized with respect to the appropriate operational phase and are only active during either phase.

This causes difficulties when it is desired to directly access single memory cells, for example in case of the mode referred to as direct memory access (DMA). In particular, such a mode allows the reading/modify circuits normally used during the operation of the memory to be bypassed, for example in order to verify the functionality of some parts of the memory and/or in order to verify operational margins of the cells. In fact, the possibility of directly accessing the cells allows to distinguish whether a given reading error is due to a failure of the relevant memory cell or to a problem on the addressing path or in the downstream circuits. Furthermore, DMA allows to evaluate whether the cell reading value, even if correct, is due to operation of the cell in a marginal region of the range of acceptable value, and thus it does not ensure a correct operation under various operating conditions of the cell, for example at different temperatures and/or as a result of aging.

It follows that the DMA accessing mode turns out to be useful in various situations, starting from the final electrical test phase (e.g., Electrical Wafer Sorting or EWS).

In memories of different type, for example in flash memories, the DMA access is simplified the presence of charge pumps capable of generating the voltages needed in the provided paths.

However, such a solution is not applicable to PCM memories, in which charge pumps are not present and the addressing paths of the cells are separate. In fact, in the reading paths, devices (N-channel transistors) are present that only operate at low voltages (for example, lower than 0.8 V) that are off at higher voltages or even, in some situations, may be damaged by higher voltages. On the other hand, in the modify paths, devices (P-channel transistors) are present that only operate at high voltages (for example, higher than 0.8 V) that are off at lower voltages.

SUMMARY

The aim of the present disclosure is to provide a PCM array that overcomes the drawbacks of the prior art.

According to the present disclosure, a memory device and an associated control method are provided.

BRIEF DESCRIPTION OF THE DRAWINGS

For a better understanding of the present disclosure, preferred embodiments thereof will now be described, purely by way of non-limiting example, with reference to the attached drawings, wherein.

DETAILED DESCRIPTION OF ILLUSTRATIVE EMBODIMENTS

Figure 1:
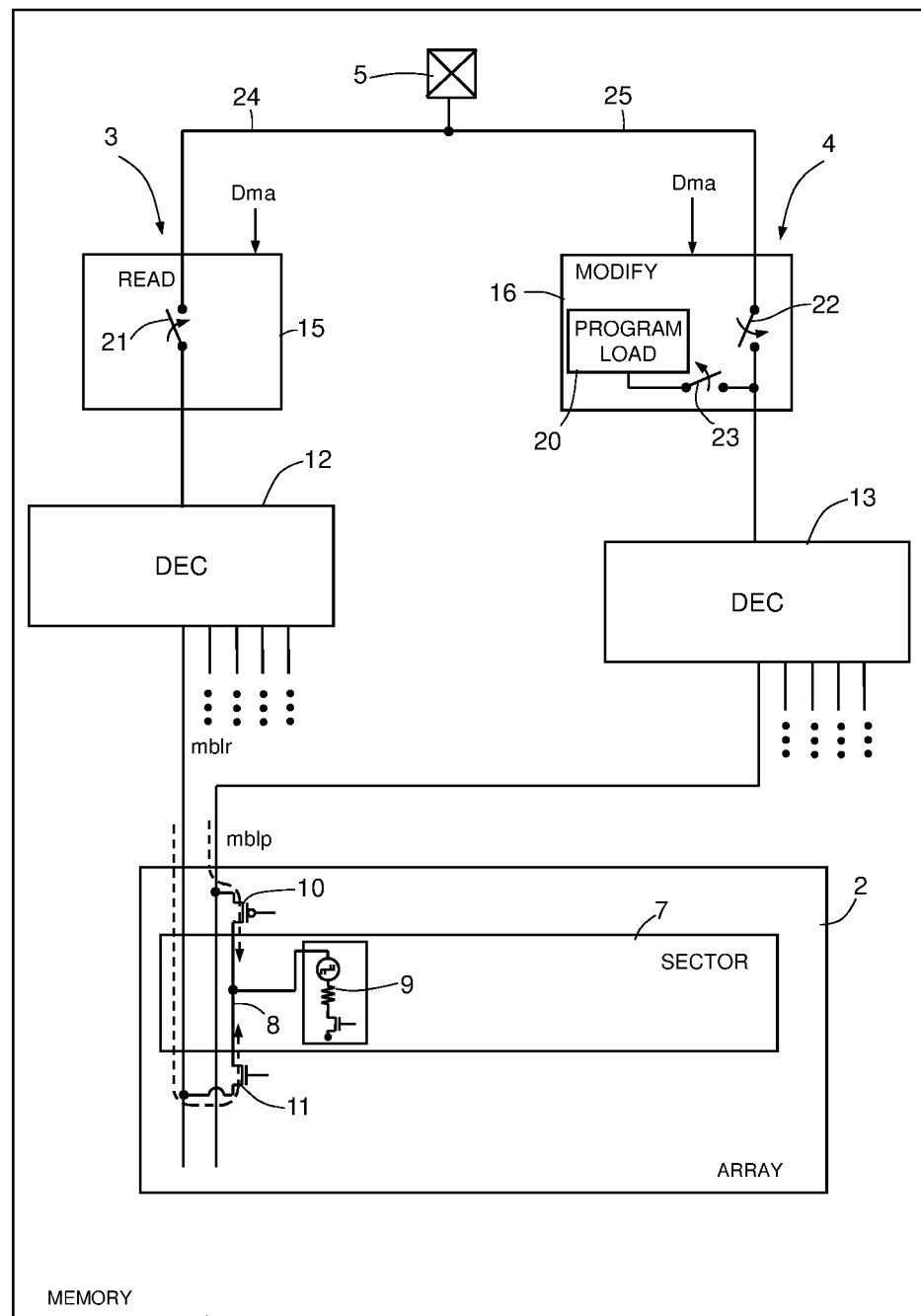
FIG. 1 shows a simplified diagram of the present PCM memory.

FIG. 1 shows, in a particularly simplified manner, some parts of a PCM memory device, indicated as a whole with reference numeral 1. In particular, FIG. 1 shows a memory array 2, a first connection path, in the following referred to as low-voltage connection path 3 since it operates at lower voltages, a second connection path, referred to in the following as high-voltage connection path 4, since it operates at higher voltages, and a direct access terminal (DMA terminal) 5. The connection paths 3, 4 are arranged in parallel, and activated together when direct access the memory array 2 is desired.

In a known manner, the memory array 2 is divided into a plurality of sectors (whereof only one sector is shown, indicated with reference numeral 7), each including memory cells (only one shown, indicated with reference numeral 9) connected to local bit lines (only one shown, indicated with reference numeral 8). Each local bit line 8 is connected to a main read bit line mblr and to a main modify bit line mblp through a first and a second MOS switch 10, 11. In particular, the first MOS switch 10 is a P type and the second MOS switch 11 is an N type.

The MOS switches 10, 11 form one level of a column decoding system further including decoding circuits, respectively read and modify circuits, 12, 13, connected to the main read and modify bit lines mblr and mblp, and not shown in detail in FIG. 1. In a known manner not described in detail and depending on selection signals not shown, the MOS switches 10, 11 and the decoding circuits 12, 13 select, from the plurality of bit lines 8, one bit line, in the following also referred to as "selected bit line 8".

The decoding circuits 12, 13 are in turn connected with the DMA terminal 5 through a read switching stage 15 and a modify switching stage 16, respectively. The switching stages 15, 16 are controlled by an access enable signal Dma generated by a control unit (not shown) so as to connect the selected local bit line 8 to the DMA terminal 5 when direct access is desired to the, or to one of the, memory cells 9 connected to the selected local bit line 8.

The read switching stage 15, the read decoding circuit 12, the main read bit line mblr and the first MOS switch 10 form the low-voltage connection path 3, whereas the modify switching stage 16, the modify decoding circuit 13, the main modify bit line mblp and the second MOS switch 11 form the high-voltage connection path 4.

Since, as indicated, the high-voltage connection path 4 is in parallel with the low-voltage connection path 3, and both are activated during direct access to the memory array 2, the modify switching stage 16 has further the function of uncoupling load circuits at high voltage, called "program load" 20, as discussed in more detail hereinafter.

In FIG. 1, the read switching stage 15 is represented by a simple read switch 21, arranged along a read DMA line 24 which connects together the DMA terminal 5 and the read decoding circuit 12; whereas the modify switching stage 16 is represented by a modify switch 22, arranged along a modify DMA line 25 which connects the DMA terminal 5 and the modify decoding circuit 13, and by a uncoupling switch 23, arranged between the high voltage load circuits 20 and the modify DMA line 25.

In this way, during direct access to the memory array 2, the uncoupling switch 23 uncouples the high voltage load circuits 20 from the high voltage connection path 4.

In the memory device 1 in FIG. 1, when direct access to the local selected bit line 8 is desired, both connection paths 3, 4 are enabled at the same time and selectively operate depending on the voltage applied to the DMA terminal 5.

Figure 2:
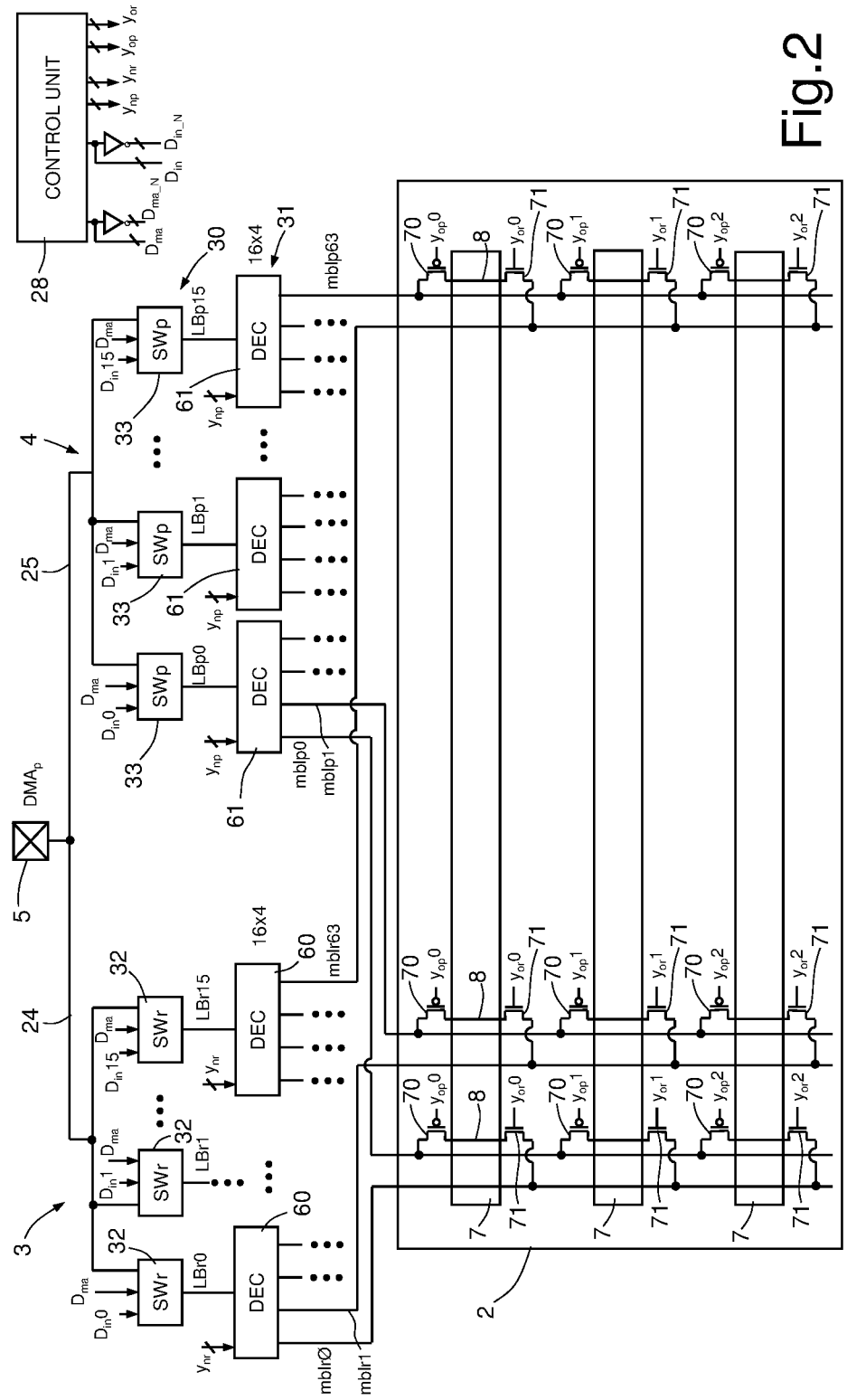
FIG. 2 shows a more detailed diagram of the memory in FIG. 1.

FIG. 2 shows the connection paths 3, 4 in more detail, highlighting some decoding stages. FIG. 2 furthermore shows a control unit 28 that generates the access enable signal Dma and addressing signals for the decoding circuits 12, 13.

In detail, in FIG. 2, the decoding circuits 12, 13 in FIG. 1 are divided over two levels, and include a first decoding level 30 that also implements the switching functions of the switching stages 15, 16 in FIG. 1, and a second decoding level 31 which may be formed in any known manner.

Here, the first decoding level includes a plurality of read switching circuits 32, for example sixteen, also indicated as SWr circuits 32, for the low-voltage connection path 3 and an equal plurality of modify switching circuits 33, also indicated as SWp circuits 33, for the high-voltage connection path 4.

Figure 3:
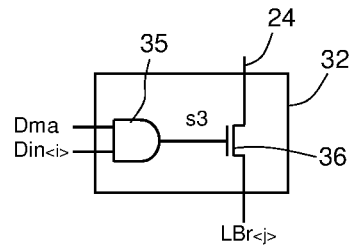
FIGS. 3 and 4 show simplified circuit diagrams of embodiments of parts of the memory of FIG. 2.

Each SWr circuit 32 is implemented for example as shown in FIG. 3. In the exemplary embodiment in FIG. 3, the SWr circuit 32 includes an AND gate 35 receiving at its input the access enable signal Dma and a first addressing signal Din<i> and outputting a read selection signal s3 supplied to the gate terminal of a MOS read switch 36. In turn, the MOS read switch 36 has a first conduction terminal connected to the read DMA line 24 and a second conduction terminal connected to a respective read first-level bit line LBr<j>. In this way, the SWr circuits 32 selectively connect only the read first-level bit line LBr<j>, selected by the first addressing signal Din<i> and the read selection signal s3, to the read DMA line 24.

In practice, the SWr circuit 32 combines the functions of the read switch 21 of FIG. 1 and of the first decoding level of the read decoding circuit 12 of FIG. 1.

Figure 4:
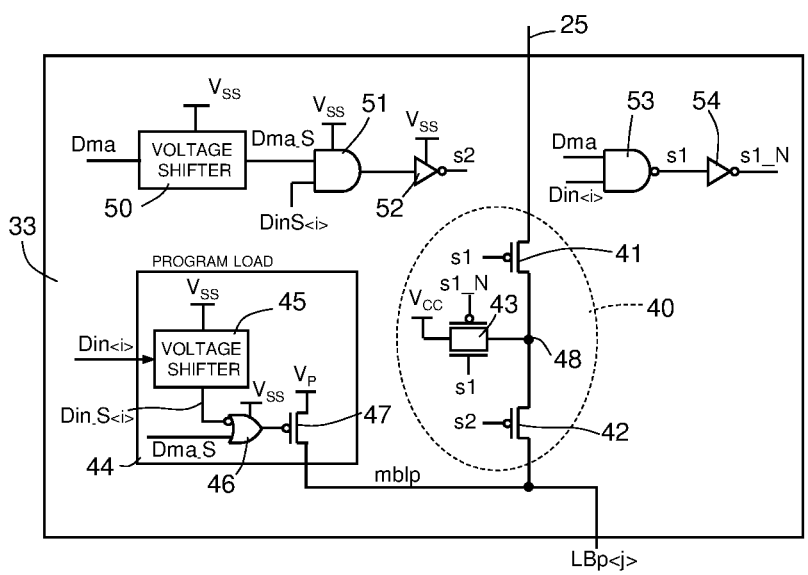

Each SWp circuit 33 is implemented for example as shown in FIG. 4. In the exemplary embodiment in FIG. 4, the SWp circuit 33 includes a modify switch element 40 arranged between the modify DMA line 25 and a respective modify first-level line LBp<j>. The modify switch element 40 is formed by a pair of PMOS transistors 41, 42, series-connected and having gate terminals respectively receiving a first and a second modify selection signal s1 and s2. The intermediate node 48 between the PMOS transistors 41, 42 is connected to a pass transistor 43 connected to a first power supply voltage $V_{cc}$, for example of 1.8 V, and receiving the first modify selection signal s1 and its inverted signal s1_N. In this way, during direct access to the memory array 2 (access enable signal Dma high) and if the selected bit line 8 is connected to the considered SWp circuit 33 (first addressing signal Din<i> high), the pass transistor 43 is off and the PMOS transistors 41, 42 connect the DMA terminal 5 to the modify first-level line LBp<j>. On the other hand, during the modify operation of the memory array 2 and with the PMOS transistors 41, 42 turned off, the pass transistor 43 maintains the first power supply voltage $V_{cc}$ on the intermediate node 48 and the potential difference existing between the modify first-level line LBp<j> (for example, at 3.6 V) and the DMA terminal 5 (for example, grounded) is divided between the PMOS transistors 41, 42, which may be implemented in a simpler manner.

The SWp circuit 33 furthermore includes a load stage 44 essentially including a first voltage shift circuit 45 connected to a shifted voltage $V_{ss}$, for example of 3.6 V, receiving the first addressing signal Din<i> and outputting a shifted addressing signal DinS<i>. The output of the first voltage shift circuit 45 is connected to an OR gate 46 receiving a shifted access enable signal Dma_S and the shifted addressing signal DinS<i>, inverted. The OR gate 46 has its output coupled to a load transistor 47, having a first conduction terminal connected to a modify voltage $V_P$, lower or equal to the shifted voltage $V_{ss}$, and a second conduction terminal connected to the modify first-level line LBp<j>.

The SWp circuit 33 furthermore includes circuits for generating the modify selection signals s1, s1_N and s2. In detail, a second voltage shift circuit 50 is connected to the shifted voltage $V_{ss}$ and receives the access enable signal Dma. The output of the second voltage shift circuit 50, supplying the shifted access enable signal Dma_S, is connected to an input of an AND gate 51, supplied by the shifted voltage $V_{ss}$ and furthermore receiving the shifted addressing signal DinS<i> generated by the first voltage shift circuit 45. The output of the AND gate 51 is supplied to an inverter 52 which generates the second modify selection signal s2. Furthermore, a NAND gate 53 receives the access enable signal Dma and the first addressing signal Din<i> and outputs the first modify selection signal s1. An inverter 54 at the output of the NAND gate 53 generates the inverted first selection signal s1_N.

In this way, during direct access, that is when the access enable signal Dma is high and the considered SWp circuit 33 is selected (addressing signal Din<i> high), the first modify selection signal s1 is low, the PMOS transistors 41, 42 are on and the circuits SWp 33 selectively connect only the modify first-level bit line LBp<j>, selected by the first addressing signal Din<i>, to the modify DMA line 25. Furthermore, again with high access enable signal Dma, the OR gate 46, supplying a high signal to the gate terminal of the load transistor 47, keeps it off, uncoupling the load stage 44 from the selected modify first-level bit line LBp<j>.

In this case, in practice, the modify switch element 40 combines the functions of the modify switch 22 of FIG. 1 and of the first decoding level of the modify decoding circuit 13 in FIG. 1.

According to a different embodiment, the voltage shift circuit 50 is common and external to the circuits SWp 33. In this case, in each SWp circuit 33, the AND gate 51 and the inverter 52, through the first addressing signal Din<i>, generate the second modify selection signal s2 specific to the SWp circuit 33.

Figure 5:
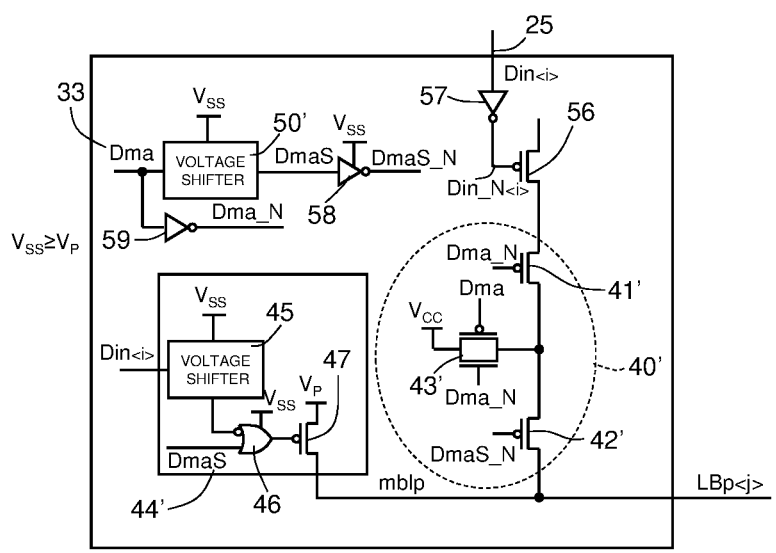
FIG. 5 shows a different embodiment of the block diagram of FIG. 4.

FIG. 5 shows one variant of the SWp circuit 33 of FIG. 4. Here, the selection of the modify first-level bit line LBp<j> is carried out through a suitable selection switch 56, formed by a PMOS transistor, arranged between the modify DMA line 25 and a pair of PMOS transistors 41', 42' and receiving on its gate terminal the first addressing signal Din<i>, inverted by an inverter 57.

FIG. 5 differs from FIG. 4 also as regards the signals supplied to the modify switch element, here indicated with 40', here correlated only with the access enable signal Dma, straight, inverted or inverted and shifted (signals Dma, Dma_N, DmaS_N), as indicated in detail in FIG. 5. The relevant elements of the modify switch element 40' have thus been indicated using the same reference numbers as in FIG. 4 and apostrophes. Furthermore, the second voltage shifter, indicated with 50', has here an output directly connected with an inverter 58 which supplies an inverted access enable signal DmaS_N for driving the PMOS transistor 42'. Here, the pass transistor, indicated with 43', receives the straight and inverted access enable signal Dma, Dma_N. The latter is generated by a suitable inverter 59.

In this way, when the access enable signal Dma is high, the modify switch element 40' enables the connection of the modify first-level bit line LBp<j> selected through the selection switch 56 (analogous to the modify switch 22 of FIG. 1) to the modify DMA line 25, and the OR gate 46 turns off the load transistor 47, uncoupling the load stage 44' from the selected modify first-level bit line LBp<j>, in an analogous manner to the second uncoupling switch 23 in FIG. 1.

Referring again to FIG. 2, the second decoding level 31 is of the conventional type and includes a plurality of read second-level decoding circuits 60, for example four for each SWr circuit 32 for the low-voltage connection path 3 and an equal plurality of second-level modify decoding circuits 61 for the high-voltage connection path 4. In a per se known manner, the second-level decoding circuits 60, 61 are connected at their input to the read first-level bit lines LBr<j> and modify bit lines LBp<j>, receive respective second addressing signals Ynr<j>, Ynp<j> and are connected at their output with a plurality of main read bit lines mblr (here 64 for each second-level read decoding circuit 60) and an equal plurality of main modify bit lines mblp. It is noted that, during DMA, the second addressing signals Ynr<j>, Ynp<j> are generated by the control unit 28 so as to be active at the same time, and the second addressing signals with the same index j are active at the same time, in order to simultaneously enable the connection paths 3, 4 leading to a same local bit line 8 during DMA, as better explained below.

Each main read bit line mblr and each main modify bit line mblp is connected to a plurality of local bit lines 8, according to a third-level decoding, in a known manner. In particular, in FIG. 2, the memory array 2 is divided into a plurality of sectors 7, and each sector 7 has a plurality of local bit lines 8 each connected to a respective read main bit line mblr and to a respective modify main bit line mblp through MOS switches 70, 71, analogous to MOS switches 10, 11 of FIG. 1. The MOS switches 70, 71 thus form a third decoding level and receive respective third addressing signals Yor<k>, Yop<k>, wherein <k> refers to a k-th sector.

Analogously to what explained with reference to FIG. 1, thus, during the DMA phase, with respect to a local bit line 8 selected by the signals Din<i>, Ynr<j>, Ynp<j>, Yor<k>, Yop<k>, both the low-voltage connection path 3 and the high-voltage connection path 4 are enabled, so that at least one of them is active, depending on the applied voltages.

Figure 6:
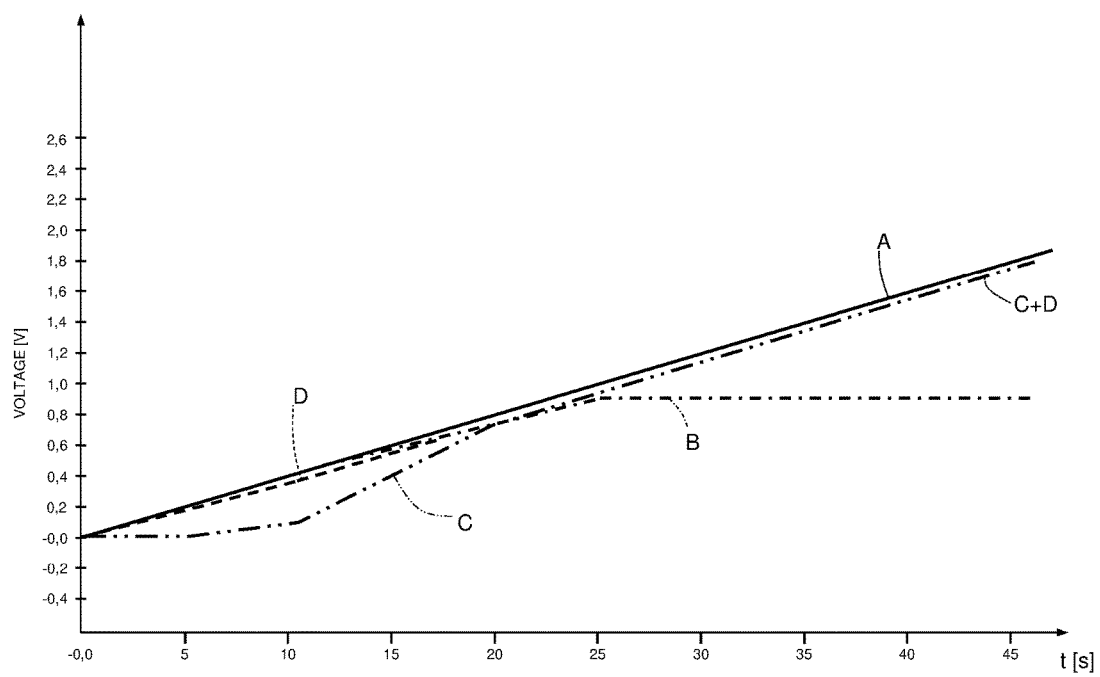
FIG. 6 shows the plot vs. time of some electrical quantities in a simulation carried out by the applicant on the memory of FIG. 2.

This is shown in the simulation in FIG. 6, carried out by applying an increasing voltage to the DMA terminal 5 (line A) and representing by the lines B, C and D, respectively, the plot vs. time of the voltage on the local bit line 8 in case of activation only of the low-voltage path 3, in case of activation only of the high-voltage path 4, and in case of activation of both the connection paths 3, 4.

As may be noted, in the example shown, with a power supply voltage $V_{cc}$ of 1.8 V, line B (activation of the low-voltage path 3 only) initially follows the plot of line A (voltage on DMA terminal 5), until around 0.8 V, then it becomes substantially constant. In fact, when the voltage on DMA terminal 5 and thus the voltage on local bit line 8 increases, the voltage $V_{GS}$ of the NMOS transistors on the low-voltage path 3 (for example of read MOS switch 36 and of MOS switches 71) becomes insufficient to keep these NMOS transistors on.

On the other hand, line C (activation of the high-voltage path 4 only) initially does not increase or increases slowly, since, when the voltage on DMA terminal 5 is low, the voltage $V_{GS}$ of the PMOS transistors on the high-voltage connection path 4 (for example PMOS transistors 41, 42, 41', 42', selection switches 56 and MOS switches 70) is insufficient to turn them on completely and they are off or weakly conducting. When the voltage on the DMA terminal 5 and thus the $V_{GS}$ of these PMOS transistors increases, they are fully turned on, whereby, when the voltage on the DMA terminal 5 is higher than 0.8 V, line C follows the plot of line A.

When the local bit line 8 is connected to both connection paths 3, 4, initially, it is electrically connected to the DMA terminal 5 by the low-voltage connection path 3, active in this phase, and successively, by the high-voltage connection path 4, active in this phase, as shown by line D. Line D thus follows the plot of line A over the entire simulation interval.

The memory device 1 described here allows the array 2 to be directly accessed, over the whole desired voltage excursion, with a reduced number of additional components and without requiring a substantial modification of the architecture or of parts of the memory device. In fact, in the memory device 1, it is sufficient to add a simple switch (read switch 21 of FIG. 1) on the low-voltage connection path 3 and a pair of switches (modify switch 22 and uncoupling switch 23 of FIG. 1) on the high-voltage connection path 4. In fact, the first level decoding on the low-voltage connection path 3 uses the first addressing signals Din<i> already available for the high-voltage connection path 4, and thus does not require the duplication of circuits and components.

The memory device 1 described here may be used in numerous fields, such as for example applications with high security requirements that use smart cards with a contact interface (such as PAY TV systems) and that have to satisfy stringent specifications on power consumption, or applications for contactless smart cards (RFID, NFC, bank cards and credit cards, etc.), where the memory module has a current budget limited by an energy harvesting system.

Figure 7:
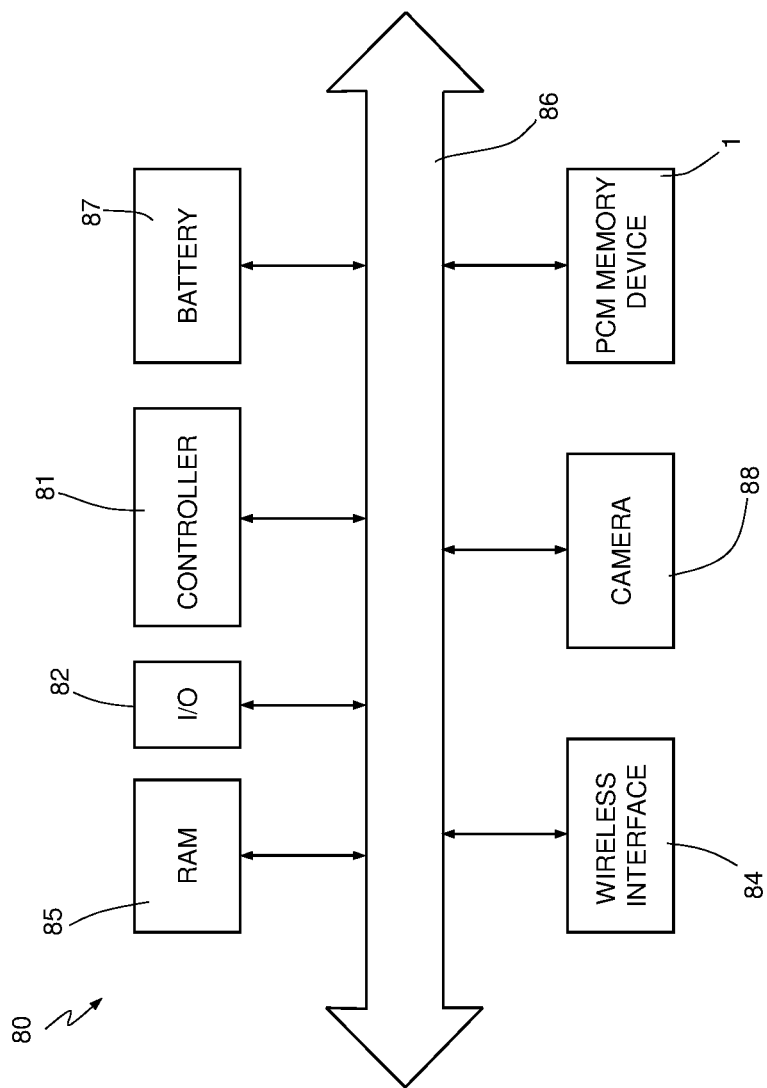
FIG. 7 is a schematic block diagram of a possible electronic apparatus incorporating a PCM device which includes the present memory.

For example, FIG. 7 illustrates a portion of an electronic apparatus 80, which may, for example, be a PDA (personal digital assistant); a portable or desktop computer, potentially with a capacity for wireless data transfer; a mobile phone; a digital audio reader; a camera or a camcorder; or other devices able of processing, storing, transmitting and receiving information.

In detail, the electronic apparatus 80 includes a controller 81 (for example having a microprocessor, a DSP or a microcontroller); an input/output device 82 (for example with a keyboard and with a display), for data input and display; the phase-change memory device 1 with the array 2 of memory cells 9 previously described; a wireless interface 84, for example an antenna, for transmitting and receiving data through a radiofrequency wireless communications network; and a RAM 85. All the components of the electronic apparatus 80 are coupled through a bus 86. A battery 87 may be used as an electrical power supply source in the electronic apparatus 80, which may furthermore have a photo or video camera or camcorder 88. Furthermore, the controller 81 may control the memory device 1.

Finally, it is clear that the memory device and the access method described and illustrated here may be modified, without departing from the scope of the present disclosure.

For example, the specific implementation of the modify switch element 40, 40' may vary, in particular this element may be replaced by a simple PMOS transistor able to withstand the involved voltages.

Furthermore, the same solution may be used in different operational phases of the memory, for example when it is desired to apply stress voltages to the memory cells, in particular for verifying the functionality thereof.

What is claimed is:

1. A device, comprising:
a memory array having a plurality of bit lines;
a low-voltage connection path configured to connect, in an operational phase of the device, an access terminal to a selected local bit line of the plurality of bit lines; and
a high-voltage connection path configured to connect, in the operational phase of the device, the access terminal to the selected local bit line, in parallel with the low-voltage connection path, wherein the low-voltage connection path comprises a read switching stage having a control terminal configured to receive an access enable signal, and wherein the high-voltage connection path comprises a modify switching stage having a control terminal configured to receive the access enable signal, wherein the modify switching stage comprises a modify switch and a uncoupling switch, the modify switch being configured to receive the access enable signal and couple the access terminal to the selected local bit line depending on the access enable signal, the uncoupling switch being configured to receive the access enable signal and uncouple a load element from the selected local bit line.

2. The device according to claim 1, wherein the read switching stage comprises a read switch having a first terminal connected to the access terminal, a second terminal coupled to the selected local bit line, and a third terminal coupled to the control terminal of the read switching stage.

3. The device according to claim 2, wherein the read switch comprises an NMOS transistor.

4. The device according to claim 2, wherein the read switching stage further comprises a decoding logic gate having a first input connected to the control terminal of the read switching stage, a second input configured to receive an addressing signal, and an output connected to the third terminal of the read switch.

5. The device according to claim 1, wherein the uncoupling switch comprises a logic gate having a first input configured to receive the access enable signal, a second input coupled to a voltage shift circuit, and an output coupled to a control terminal of the load element, the load element being connected between a modify supply line and the selected local bit line.

6. The device according to claim 1, wherein the modify switch has a first terminal coupled to the access terminal, a second terminal coupled to the selected local bit line, and a control terminal coupled to the control terminal of the modify switching stage.

7. The device according to claim 6, wherein the modify switching stage further comprises a selection switch having a first terminal connected to the access terminal, a second terminal connected to the modify switch, and a control terminal configured to receive an addressing signal.

8. The device according to claim 6, further comprising a logic circuit configured to receive the access enable signal and an addressing signal and for generating a modify selection signal supplied to the control terminal of the modify switch.

9. The device according to claim 1, wherein the memory array comprises a plurality of phase-change memory cells.

10. A method for operating a phase-change memory device having a memory array comprising a plurality of bit lines, the method comprising:
connecting, in an operational phase of the phase-change memory device, an access terminal of the phase-change memory device to a selected bit line of the plurality of bit lines through a low-voltage connection path;
connecting, in the operational phase of the phase-change memory device, the access terminal to the selected bit line through a high-voltage connection path in parallel with the low-voltage connection path;
receiving an access enable signal having an enable logic state and enabling the high-voltage connection path and the low-voltage connection path in presence of the enable logic state; and
generating an addressing signal, generating a read selection signal and a modify selection signal based on the addressing signal and the access enable signal, supplying the read selection signal to a read switch arranged on the low-voltage connection path, and supplying the modify selection signal to a modify switch arranged on the high-voltage connection path.

11. A device, comprising:
a memory cell coupled to a selected local bit line;
a first switching stage configured to couple a memory access terminal to the selected local bit line by a first connection path in response to an access enable signal; and
a second switching stage configured to couple the memory access terminal to the selected local bit line by a second connection path in parallel to the first connection path and in response to the access enable signal, wherein the second switching stage comprises a modify switch and a uncoupling switch, the modify switch being configured to receive the access enable signal and couple the memory access terminal to the selected local bit line depending on the access enable signal, the uncoupling switch being configured to receive the access enable signal and uncouple a load element from the selected local bit line when the modify switch couples the memory access terminal to the selected local bit line.

12. The device of claim 11, wherein the access enable signal is configured to provide a direct memory access to the memory cell, and wherein the first switching stage and the second switching stage are configured to simultaneously activate the first connection path and the second connection path in response to the direct memory access.

13. The device of claim 11, wherein the first connection path operates at a first voltage, and wherein the second connection path operates at a second voltage greater than the first voltage.

14. The device of claim 11, wherein the first switching stage comprises a read switch having a first terminal connected to the memory access terminal, a second terminal coupled to the selected local bit line, and a third terminal configured to receive the access enable signal from a decoding logic gate.

15. The device of claim 11, wherein the memory cell comprises a phase-change memory cell.

16. The device of claim 14, wherein the first switching stage further comprises the decoding logic gate having a first input configured to receive the access enable signal, a second input configured to receive an addressing signal, and an output connected to the third terminal of the read switch.

17. The device of claim 14, wherein the decoding logic gate is an AND gate.

18. The device of claim 11, wherein the uncoupling switch comprises a logic gate having a first input configured to receive the access enable signal, a second input coupled to a voltage shift circuit, and an output coupled to a control terminal of the load element, the load element being connected between a modify supply line and the selected local bit line.

19. The device of claim 18, wherein the modify switch has a first terminal coupled to the memory access terminal, a second terminal coupled to the selected local bit line, and a control terminal coupled to a control terminal of the second switching stage.

20. A method for operating a phase-change memory device having a memory array comprising a plurality of bit lines, the method comprising:
connecting, in an operational phase of the phase-change memory device, an access terminal of the phase-change memory device to a selected bit line of the plurality of bit lines through a low-voltage connection path;
connecting, in the operational phase of the phase-change memory device, the access terminal to the selected bit line through a high-voltage connection path in parallel with the low-voltage connection path;
receiving an access enable signal having an enable logic state and enabling the high-voltage connection path and the low-voltage connection path in presence of the enable logic state; and
generating an addressing signal, generating a read selection signal based on the addressing signal and on the access enable signal, supplying the read selection signal to a read switch arranged on the low-voltage connection path, and supplying the addressing signal and the access enable signal to a modify switch arranged on the high-voltage connection path.

21. The method according to claim 20, further comprising uncoupling a load stage from the selected bit line in presence of the enable logic state of the access enable signal.

* * * * *